United States Patent
Marr et al.

[11] Patent Number: 5,999,466
[45] Date of Patent: Dec. 7, 1999

[54] METHOD, APPARATUS AND SYSTEM FOR VOLTAGE SCREENING OF INTEGRATED CIRCUITS

[75] Inventors: Ken W. Marr; Dean Gans, both of Boise, Id.

[73] Assignee: Micron Technology, Inc., Boise, Id.

[21] Appl. No.: 09/006,320

[22] Filed: Jan. 13, 1998

[51] Int. Cl.⁶ .................................................. G11C 7/00
[52] U.S. Cl. .......................................... 365/201; 365/226
[58] Field of Search .................................. 365/201, 226, 365/200

[56] References Cited

U.S. PATENT DOCUMENTS

| | | | |
|---|---|---|---|
| 5,258,954 | 11/1993 | Furuyama | 365/201 |
| 5,272,673 | 12/1993 | Sugibayashi | 365/201 |
| 5,357,193 | 10/1994 | Tanaka et al. | 365/201 |
| 5,424,990 | 6/1995 | Ohsawa | 365/201 |
| 5,426,616 | 6/1995 | Kajigaya et al. | 365/226 |
| 5,568,435 | 10/1996 | Marr . | |
| 5,568,436 | 10/1996 | Furuyama | 365/201 |

*Primary Examiner*—David Nelms
*Assistant Examiner*—Anh Phung

[57] ABSTRACT

A method, apparatus and system for cost-effectively quantifying the likelihood of operational reliability problems includes a supply voltage configuration circuit and a test mode generation circuit. The test mode generation circuit and supply voltage configuration circuit, operating together in a test mode, provide selected supply voltages to selected circuit blocks of an integrated circuit. In non-test operation, the test mode generation circuit and the supply voltage configuration circuit are transparent to the operation of the tested integrated circuit.

38 Claims, 5 Drawing Sheets

METHOD, APPARATUS AND SYSTEM FOR VOLTAGE SCREENING OF INTEGRATED CIRCUITS

BACKGROUND OF THE INVENTION

The invention relates generally to testing of integrated circuits, and more particularly to methods, circuits and systems for applying voltage screening to integrated circuits containing memory arrays.

Consumer electronic devices and computers are on the path of ever-advancing power. Contributing to that advance is the ever-increasing performance of semiconductor memories. For example, semiconductor memories are becoming faster and more dense.

Development of faster and denser memories has generally involved advances both in semiconductor manufacturing technology and in memory circuit design. Advances in semiconductor manufacturing technology have included reduction of on-chip geometries and use of multiple levels of low resistance metal interconnect. Advances in circuit design have included use of sense amplifiers coupled to memory bitlines, as well as use of bitline equalizers to balance bitlines prior to read access.

While fast, high-density memories are desirable, it is at least equally desirable that semiconductor memories be reliable. Reliability issues, however, tend to become more difficult to resolve as the circuits become more complex. In the case of random access memory (RAM), the technology trend is to increasingly complex physical geometries and circuit architectures, particularly in combination with enhanced operating speeds and reduced voltages, and all leading to smaller design tolerances, lower signal margins, and other reliability issues not encountered by previous generations of memory circuits. And in the specific case of static RAM, reliability issues can develop over time, the issues being founded on defects which may be disguised, e.g., disguised by the positive feedback within the memory cell. Reliability issues, accordingly, have become a powerful force for development of testing solutions.

In addition to reliability, another important aspect of manufacturing successfully semiconductor memories is cost. The manufacture of semiconductor memory is carried on throughout the world and is very competitive, particularly on cost. Investment in the building, equipping and operating of the modern semiconductor manufacturing facility tends to drive unit costs higher. Notwithstanding such investment, unit costs are generally controlled by high volume, batch production. This production cost benefits, however, can be undermined if the memory device requires substantial time for proper testing, which problem tends to become ever acute as memories' advance in density and complexity.

The testing of semiconductor memories typically takes place prior to shipping the devices to customers and then, increasingly, through the customers' incorporation of the devices in their products and on through the use of such products in the field. Prior to shipping, the testing generally is performed in two phases. The first phase is typically referred to as "wafer probe" or "wafer sort". This phase includes the testing of functional and/or parametric performance of the devices as individual integrated circuits, typically while the integrated circuits are still in wafer form, i.e., before any tested integrated circuit has been cut apart from the wafer and while any special test pads are accessible. The second phase is typically referred to as "final test". This phase includes the testing of functional and/or parametric performance of the memory devices as individually packaged integrated circuits using external pins of the device.

Certain functional and parametric testing is difficult to implement in a cost effective manner. In wafer sort, for example, because the tested integrated circuit is in wafer form, it tends not to reach the same temperatures that a packaged integrated circuit reaches, particularly after a period of operation. Unfortunately, even at final sort the packaged integrated circuit takes additional time, under power, to reach the internal temperatures typically associated with marginal or failing performance. Any such additional time is recognized generally to increase the cost of testing.

One conventional solution to this problem has been to raise the integrated circuit's temperature through controlled application of heat (typically referred to as "heat soaking"). Even so, heat soaking relies on expensive equipment and yet can waste valuable time. As an example, heat soaking consumes time in ramping to each of the generally plural temperatures deemed necessary for proper testing.

Accordingly, a need exists for methods, apparatus and systems for cost-effectively screening semiconductor products, such as memories, for reliability problems.

SUMMARY OF THE INVENTION

A method, apparatus and system for quickly and cost-effectively quantifying the likelihood of a reliability problem includes a supply voltage configuration circuit and a test mode generation circuit. The test mode generation circuit and supply voltage configuration circuit, operating together in a test mode, provide different supply voltages to two circuit blocks of an integrated circuit. In normal operation, the test mode circuitry and supply voltage configuration circuit are transparent to the operation of the integrated circuit.

In an embodiment of the present invention, a semiconductor memory device has two circuit blocks: a memory array and peripheral circuitry, integrated on the same die. The semiconductor memory device further includes a test mode generating circuit and a supply voltage configuration circuit to provide selected, generally divergent, voltages to either or both of two circuit blocks during a test.

In another embodiment of the present invention, the semiconductor memory device has two circuit blocks within the memory array and/or the peripheral circuitry and the supply voltage configuration circuit comprises a voltage supply multiplexer, such multiplexer receiving supply voltages and, responsive to control signals, directing selected of the supply voltages to selected nodes of each of the two circuit blocks, whether the blocks are associated with the memory array or the peripheral circuitry, or both.

The various features of novelty which characterize the invention are pointed out with particularity in the claims annexed to and forming a part of this specification. For a better understanding of the invention, its operating advantages and specific objects attained by its use, reference should be made to the accompanying drawings and descriptive matter in which its preferred embodiments are illustrated and described, wherein like reference numerals identify the same or similar elements.

DETAILED DESCRIPTION

Overview

Semiconductor memory devices generally are integrated circuits comprising a memory array and peripheral circuitry. The memory array typically includes memory specific elements, including one or more of, among others, memory cells, bit lines, bit line load devices, wordlines, wordline drivers, and bit line prechargers. Peripheral circuitry typically includes interface specific elements, including, among others, input buffers, output buffers, and electrostatic discharge protection circuits.

In conventional testing of semiconductor memory devices, the memory array and the peripheral circuitry have applied thereto a common supply voltage. In this invention, it is proposed to test by applying one or more selected supply voltages to one or more selected nodes within each cell of the memory array, as well as to the peripheral circuitry. Generally, these selected supply voltages are enabled to diverge not only from each other, but also from the supply voltage specified for the memory array, i.e., that voltage at which the array (and, typically, the device) is supposed to be operated.

In so using these selected supply voltages, the testing is directed to identify not only semiconductor memory devices having actual problems, but also those having potential reliability problems. That is, the testing is directed to screen out unreliable memory cells more effectively than testing at only one, common supply voltage. In particular, the testing is directed to screen out memory cells and devices that are likely to become unreliable as time passes, e.g., when the memory device is in the field. Once a cell is found unreliable, appropriate action can be taken, including as non-exhaustive examples, (i) discarding the memory device, such as at wafer or final test, (ii) correcting the problem, such as by bypassing the cell in favor of another in a redundant array, whether this is in wafer/final test, in customer screening or in the field, (iii) triggering service of a product in the field, such as by automatically sending a service message (via, e.g., modem, radio or satellite links), and (iv) sustaining operation, such as by establishing one or more supply voltages directed to counter the reliability issue(s) uncovered in the test.

Voltage screening according to this invention, particularly respecting memory cells, typically contemplates employing supply voltages that are less than the cell's specified supply voltages. Often one or more of the memory cell's supply voltages are at or below the supply voltage applied to the peripheral circuitry, which applied voltage can itself be selected below that level associated with proper function of the peripheral circuitry. It is recognized, however, that (i) the memory cell's supply voltages can be selected to exceed their specified level(s), (ii) the cell's supply voltages can be selected to exceed the supply voltage applied to the peripheral circuitry, and (iii) both. It is also recognized that voltage supply provided to the peripheral circuitry can be selected to exceed the level specified for this circuitry. In any case, the selected supply voltages, and the selected nodes of application thereof, preferably are determined so as to optimize the identification of unreliable units.

Accordingly, embodiments of the present invention include systems, methods and apparatus for supplying, in a test mode, one or more selected supply voltages to one or more selected nodes, generally so that each node has applied thereto one of the selected supply voltages on a one-to-one basis, resulting in the selected nodes having applied thereto a selected combination of the selected supply voltages. Embodiments of the present invention, as applied to semiconductor memories, provide for testing of the memory device with divergent, selected supply voltages being applied to the peripheral circuitry and/or to the memory array, specifically at one or more selected nodes in each such component. Embodiments of the present invention isolate one or more nodes within the memory array for coupling to respective selected supply voltages. In addition, embodiments of the present invention enable access to such nodes both (i) in wafer sort, with or without use of special test pads (i.e., pads which are not connected to pins or otherwise accessible in the packaged part and (ii) in final and field testing through the package pins.

Although the detailed description is directed to embodiments of the present invention in the context of semiconductor memories, embodiments of the present invention also encompass integrated circuits other than semiconductor memories. Generally, it will be understood that the methods, apparatus and systems described herein respecting memory devices are applicable to integrated circuits that can be segmented into first and second circuit blocks which, in non-test operation, have respective specified supply voltages (shared or otherwise). As to such integrated circuits, testing proceeds by selecting first and second supply voltages, at least one of which diverges from a specified supply voltages so that, in applying the first supply voltage to the first circuit block and the second supply voltage to the second circuit block, at least one such circuit block can be driven to other than a specified supply voltage associated with such block.

Other embodiments of the present invention follow from the descriptions and claims that follow, as well as from the attached figures and the discussions above.

Structure

Figure 1:
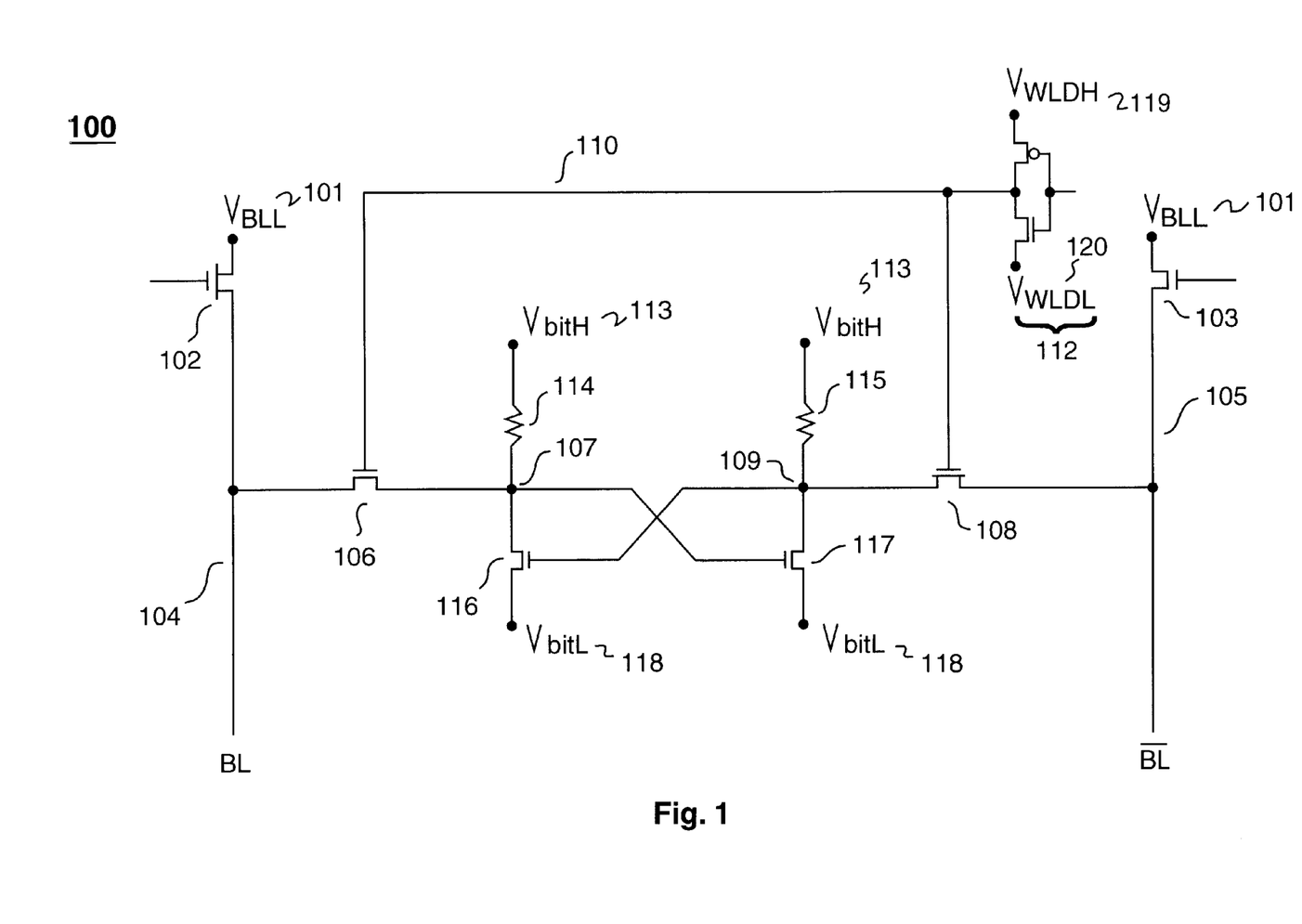
FIG. 1 is a schematic diagram of a static random access memory (SRAM) cell in accordance with the present invention.

A schematic representation of a static random access memory (SRAM) cell 100 is shown in FIG. 1. SRAM cell 100 comprises a pair of bitlines, a memory bit coupled to the bitlines by access devices, a wordline driver that controls whether the access devices are in a conducting state, and a pair of bitline load devices. More particularly, bitline load devices 102, 103 are coupled, respectively, to bitlines BL 104 and BL-bar 105. In exemplary cell 100, bitline load devices 102, 103 are each an n-channel field effect transistors (NFET) and both devices 102, 103 are coupled to a voltage supply node $V_{BLL}$ 101. Bitline BL 104 is coupled through an access device 106 to a node 107. Similarly, bitline BL-bar 105 is coupled through an access device 108 to a node 109. In exemplary cell 100, access devices 106, 108 are each NFETs.

As shown in FIG. 1, the gates of access devices 106, 108 are coupled in common to a wordline node 110. Wordline node 110 is coupled to the output terminal of a wordline driver 112.

A first load device 114 is coupled between a voltage supply node $V_{bitH}$ 113, and node 107. A second load device 115 is coupled between voltage supply node $V_{bitH}$ 113 and node 109. As shown in FIG. 1, the first and second load devices 114, 115 are resistors. It is recognized that the load devices 114, 115 can be other than resistors, without departing from the principles of the invention.

A first transistor 116 is coupled drain-to-source between node 107 and a voltage supply node $V_{bitL}$ 118. A second transistor 117 is coupled drain-to-source between node 109 and voltage supply node $V_{bitL}$ 118. In exemplary cell 100, first and second transistors 116, 117 are NFETs. These transistors 116, 117 are cross-coupled such that the gate of first transistor 116 is coupled to the drain of second transistor 117 at node 109, while the gate of second transistor 117 is coupled to the drain of first transistor 116 at node 107.

Wordline driver 112 is shown as an inverter having a p-channel field effect transistor (PFET) as a pull-up and an NFET as a pull-down. Those skilled in the art will recognize that other circuit configurations can be used to provide sufficient drive to wordline node 110. Wordline driver 112 is coupled to a voltage supply node $V_{WLDH}$ 119 and a voltage supply node $V_{WLDL}$ 120.

In test operation, voltage supply nodes $V_{BLL\ 101,\ VbitH}$ 113, and $V_{WLDH}$ 119 can, but need not, have a common supply voltage. Moreover, any supply voltage that is employed need not, but can, be the same as a supply voltage applied to the peripheral circuitry. That is, one or more of the supply voltages applied to the nodes 101, 113, 119 can be selected to diverge from supply voltage(s) applied to the peripheral circuitry. In normal operation, by comparison, these nodes 101, 113, 119 typically are coupled to a common (positive) supply voltage and, indeed, this common supply voltage typically is also applied to the peripheral circuitry.

Similarly, in test operation, voltage supply nodes $V_{bitL}$ 118 and $V_{WLDL}$ 120 can, but need not, have a common supply voltage. Moreover, any supply voltage that is employed need not, but can, be the same as a supply voltage applied to the peripheral circuitry. That is, one or more of the supply voltages applied to the nodes 118, 120 can be selected to diverge from supply voltage(s) applied to the peripheral circuitry. In addition, these nodes 118, 120 typically do not, but can be selected to share a common supply voltage with one or more of the nodes 101, 113,119. By comparison, in normal operation, these nodes 101, 113, 119 typically are coupled to a common (ground) supply voltage and, indeed, this common ground typically is also applied to the peripheral circuitry.

Those skilled in the art having the benefit of this disclosure will recognize that, without departing from the present invention, various changes may be made to cell 100. As an example, appropriately configured n-channel or p-channel field effect transistors can be substituted for resistors in implementing first and second load devices 114, 115. As another example, the bitlines 104, 105 can be coupled together using a bitline equalizer device. As yet another example, one or more of the components can be omitted or replaced with alternative technology (e.g., the bitline load devices), without departing from the principles of the invention.

Figure 2A:
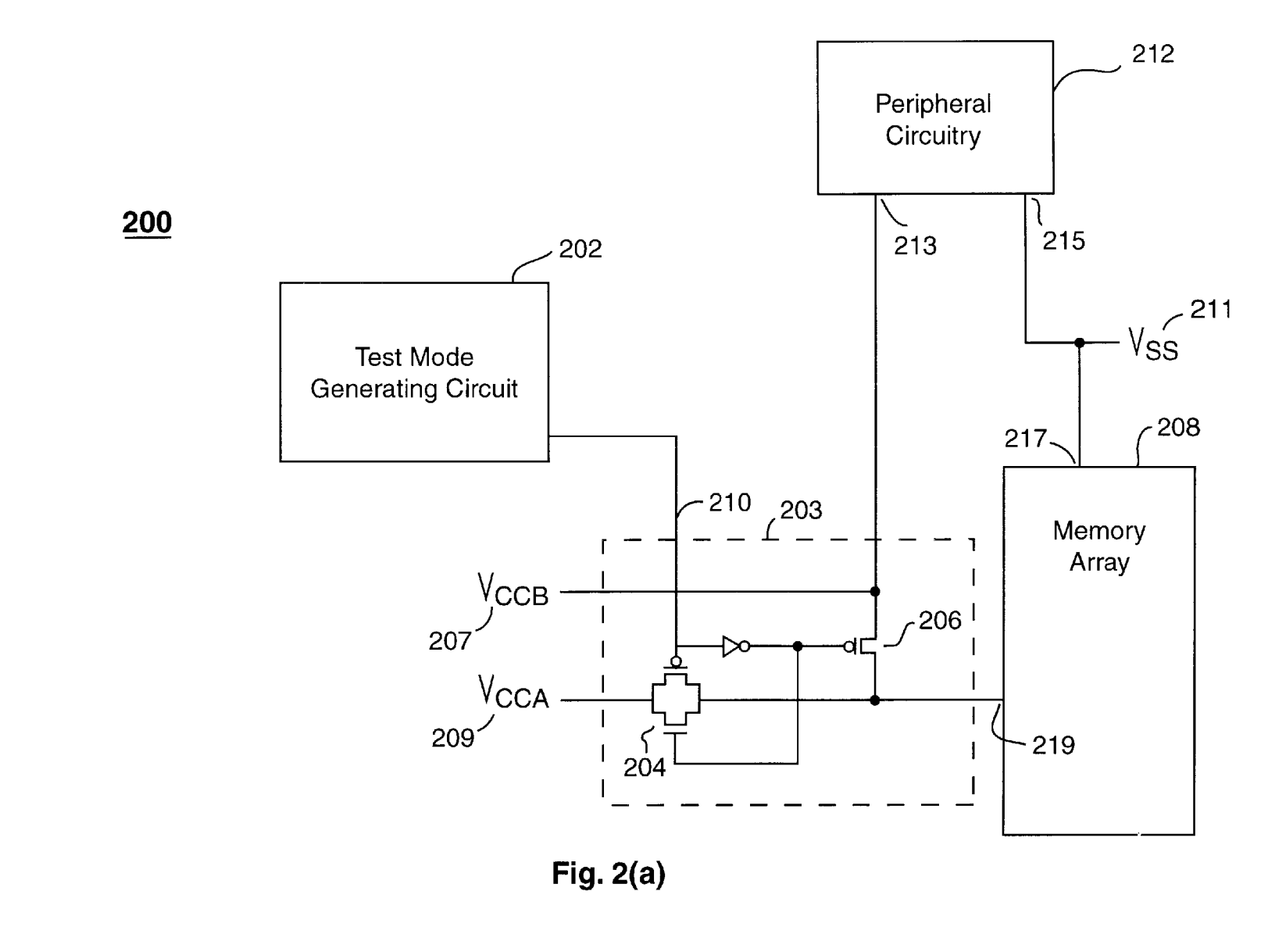
FIG. 2(a) is a schematic diagram of a memory device in accordance with the present invention.

FIG. 2(a) shows a portion of a memory device 200, in accordance with the present invention. The memory device 200 comprises a test mode generating circuit 202 coupled to a supply voltage configuration circuit 203, the circuit 203 being coupled to peripheral circuitry 212, memory array 208 and voltage sources $V_{CCA}$ 209 and $V_{CCB}$ 207. The supply voltage configuration circuit 203 comprises, in this embodiment, a CMOS transmission gate 204 and a PFET 206. The transmission gate 204 is disposed between voltage source $V_{CCA}$ 209 and, via voltage supply node 219, memory array 208. The PFET 206 is disposed between voltage source $V_{CCB}$ 207 and, via voltage supply node 219, memory array 208.

The PFET 206 generally is implemented so as to provide current sufficient for proper operation of the memory array 208. For example, the PFET's geometries respond to a determination of the maximum IR drop allowable thereacross, particularly during conditions of the array's maximum current draw.

In this embodiment of the present invention, memory array 208 is provided one of voltage sources $V_{CCA}$ 209 and $V_{CCB}$ 207, depending on a control signal 210 generated by test mode generating circuit 202. The voltage source $V_{CCB}$ 207 is applied as a supply voltage when the state of the control signal 210 is high, which state turns on the PFET 206 and turns off the transmission gate 204. In turn, the voltage source $V_{CCA}$ 209 is applied as a supply voltage when the state of the control signal 210 is low, which state turns off the PFET 206 and turns on the transmission gate 204.

In the embodiment of FIG. 2(a), peripheral circuitry 212 is provided with voltage source $V_{CCB}$ 207 via voltage supply node 213. Although, as shown, the voltage source 207 is provided to the peripheral circuitry 212 by the supply voltage configuration circuit 203, it is recognized that this and other voltage sources can be provided conventionally, i.e., other than through the configuration circuit 203 and the test mode generation circuit 202. In addition, it is to be recognized that voltage sources can also be provided to the memory array 208 conventionally, i.e., other than through the configuration circuit 203 and test mode generation circuit 202. As an example, voltage source $V_{SS}$ 211 (e.g., a ground) is coupled directly to both the peripheral circuit 212 and the memory array 208, via respective voltage supply nodes 215 and 217.

It is also recognized that voltage sources provided to peripheral circuitry 212 preferably are so provided independently of the voltage sources provided to the memory array 208. Moreover, it is contemplated that one or more of the peripheral circuitry's voltages can also be subject to selection, as is indicated (but not implemented) by routing the voltage source 207 though the configuration circuit 203. That is, according to this invention, the voltage sources are selectable independent of one another and, in turn, the nodes to which the selected sources are applied preferably are selectable independent of other nodes, whether the nodes are associated with the peripheral circuit 212, the memory array 208 or otherwise.

Generally, in this embodiment, voltage sources 207, 209 are provided to the packaged memory device 200 via package pins.

Figure 2B:
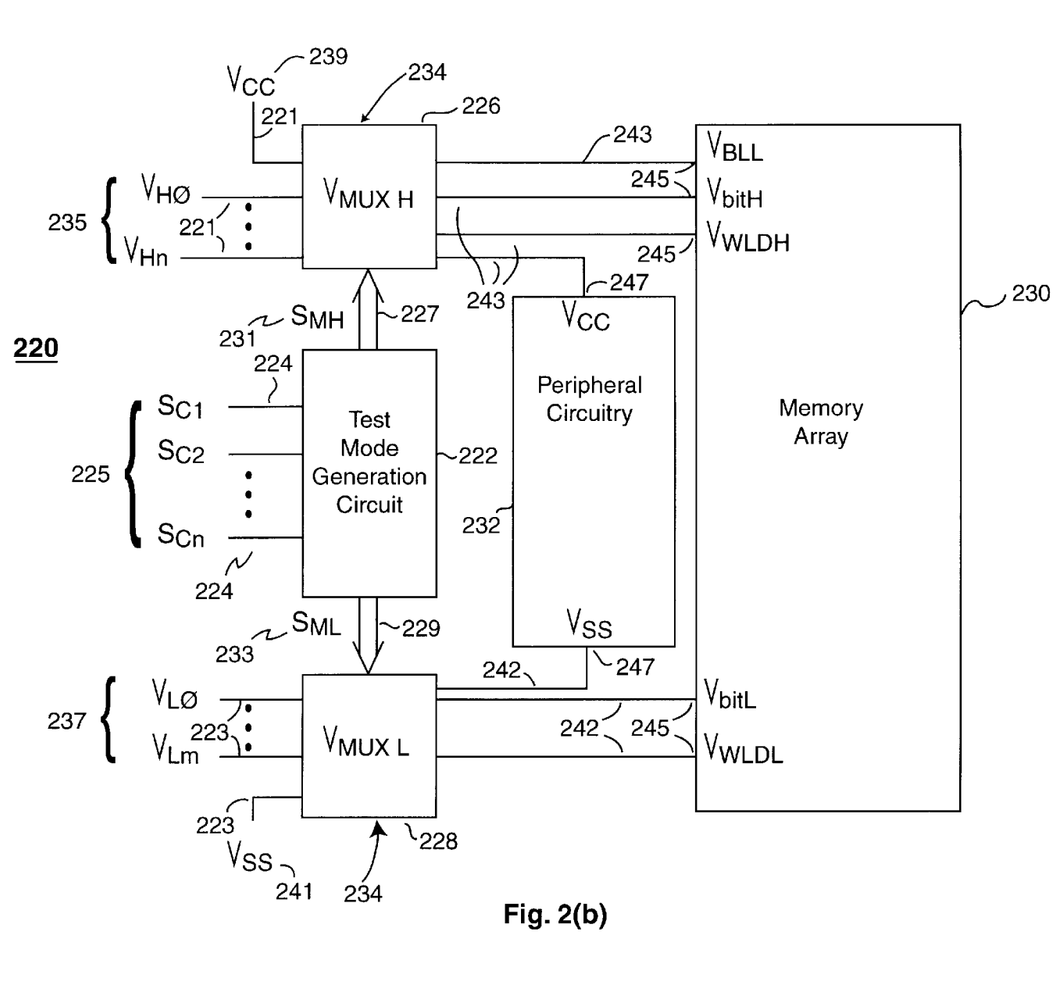
FIG. 2(b) is a schematic diagram of a memory device in accordance with the present invention.

FIG. 2(b) shows a portion of a memory device 220, in an alternative embodiment of the present invention. Memory device 220 comprises a test mode generation circuit 222, memory array 230, peripheral circuitry 232 and supply voltage configuration circuit 234. The supply voltage configuration circuit 234 comprises, in this embodiment, supply voltage multiplexers 226 and 228.

The test mode generation circuit 222 is coupled (i) to multiplexer $V_{MUXH}$ 226 via connection 227 and (ii) to multiplexer $V_{MUXL}$ 228 via connection 229. The test mode generation circuit 222 has one or more input terminals 224 for receipt of control signals $S_{C_1}$–$S_{C_n}$ 225. Responsive to the signals 225, the test mode generation circuit 222 generates control signals $S_{MH}$ and $S_{ML}$, 231,233 which, via connections 227, 229, direct operation of a respective voltage multiplexer 226, 228.

Voltage supply multiplexer $V_{MUXH}$ 226 includes one or more input terminals 221. These terminals 221 preferably are coupled to one or more voltage sources $V_{H0}$–$V_{Hn}$ 235. It is also preferred that one of such voltage sources 235 comprise a first specified voltage source $V_{CC}$ 239. This specified voltage source 239 typically is positive, comprising the voltage at which the memory array 230 (and, typically, the device 220) is supposed to be operated. However, the voltage source 239 may be some other supply voltage, without departing from the principles of the invention, e.g., a voltage below which the peripheral circuitry 232 may not properly function.

Similarly, voltage supply multiplexer $V_{MUXL}$ 228 includes one or more input terminals 223. These terminals 223 preferably are coupled to one or more voltage sources $V_{L0}$–$V_{Ln}$ 237. It is also preferred that one of such voltage sources 237 comprise a second specified voltage source $V_{SS}$ 241. This specified voltage source 241 typically is a ground, comprising the low voltage at which the memory array 230 (and, typically, the device 220) is supposed to be operated. However, the voltage source 241 may be some other supply voltage, without departing from the principles of the invention, e.g., a low voltage above which the peripheral circuitry 232 may not properly function.

In the illustrative embodiment shown in FIG. 2(b), the multiplexers 226, 228 comprise a plurality of respective output terminals 243, 242. These output terminals 243, 242 preferably are coupled to one or more voltage supply nodes 245 of the memory array 230. These output terminals 243 preferably are also coupled to one or more voltage supply nodes 247 of the peripheral circuitry 232.

As shown, multiplexer $V_{MUXH}$ 226 provides voltage sources 235, 239, via output terminals 243, as voltage supplies to each of (i) the voltage supply node $V_{BLL}$ of the bit line load devices, (ii) the voltage supply node $V_{bitH}$ of the memory cells, (iii) the voltage supply node $V_{WLDH}$ of the wordline drivers and (iv) the voltage supply node $V_{CC}$ of the peripheral circuitry 232. In turn, multiplexer $V_{MUXL}$ 228 provides voltage sources 237, 241, via output terminals 242, as voltage supplies to each of (i) to the voltage supply node $V_{bitL}$ of the memory cells, (ii) the voltage supply node $V_{WLDL}$ of the wordline drivers and (iii) the voltage supply node $V_{SS}$ of the peripheral circuitry 232.

Multiplexers 226, 228 are responsive to respective control signals $S_{MH}$ 231 and $S_{ML}$ 233, such that each output terminal 243, 242 provides at least one of the voltage sources 235, 237, 239 and 241 to a node 245, 247 associated with the respective terminal 243, 242. It is preferred that any one of the voltage sources 235, 239 may be coupled, through control of the multiplexer 226, to any one or more of the output terminals 243 and, therefrom, to any one or more of the nodes 245, 247. Similarly, it is preferred that any one of the voltage sources 237, 241 may be coupled, through control of the multiplexer 228, to any one or more of the output terminals 242 and, therefrom, to any one or more of the nodes 245, 247.

Although two multiplexers 226, 228 are described, multiplexers of other number can be used without departing from the principles of the invention. As an example, the function of the two multiplexers shown can be accomplished using a unitary multiplexer. In that case, the unitary multiplexer receives control signals from the test mode generation circuit 222, while being coupled to selected voltage sources, including, typically, both specified voltage sources 239 and 241. Responsive to the control signals, each output terminal of the unitary multiplexer provides at least one of the received voltage sources to the voltage supply nodes 245, 247 associated with the respective output terminal. Again, it is preferred that any one of the voltage sources may be coupled, through control of the unitary multiplexer, to any one or more of the output terminals and, therefrom, to any one or more of the nodes 245, 247.

It is to be understood that the multiplexers 226, 228 can be implemented to provide voltage sources other than as shown, without departing from the principles of the invention. As an example, either/both multiplexers 226, 228 can be implemented to provide voltage sources to nodes other than nodes 245, 247 described above, whether such other nodes are supported alone or in combination with the described nodes 245, 247. As another example, either/both multiplexers 226, 228 can be implemented to provide voltage sources to fewer than all (e.g., selected) of the described nodes 245, 247, i.e., some of the described nodes 245, 247 can be supplied other than via the multiplexers 226, 228. As yet another example, the multiplexer 226 can be implemented so as to omit provision of a voltage source 235, 239 to the peripheral circuitry 232, such provision instead being achieved by appropriate coupling of a voltage source to a node 247 (e.g., by hard-wiring $V_{CC}$ 239 to a node 247). As still another example, the multiplexer 228 can be implemented so as to omit provision of a voltage source 237, 241 to the peripheral circuitry 232, such provision instead being achieved by appropriate coupling of a voltage source to a node 247 (e.g., by hard-wiring $V_{SS}$ 241 to a node 247).

It is also to be understood that either/both of the multiplexers 226, 228 can be implemented to provide, at respective output terminals 243, 242, supply voltages that are derived from one or more of the voltage sources 235, 239, 237, 241. As an example, the multiplexers 226, 228 can be implemented to include, or have associated therewith, circuitry that generates supply voltages by multiplying, dividing, adding, subtracting, interpolating, extrapolating or otherwise conditioning one or more voltage sources 235, 239, 237, 241. In one embodiment of this conditioning, the supply voltages are generated from one or both of the specified voltage sources 239, 241. When implemented, the supply voltage conditioning is provided preferably by voltage generation circuitry 424 (see FIG. 4) responsive to and under the direction of the control signals 227, 229 received from the test mode generator circuit 222.

The operation of the multiplexers 226, 228 can be implemented other as described above, without departing from the principles of the invention. That is, it is to be understood that either/both of the multiplexers 226, 228 can be implemented to provide supply voltages to respective output terminals 243, 242 in the absence of control signals 225 and/or 227, 229. As an example, the test mode generation circuit 222 can be implemented to generate control signals 227, 229 in the absence of control signals 225, e.g. based on a timing arrangement. As another example, control signals are provided directly to one or both multiplexers 226, 228, such control signals being generated other than in the device 220 itself. As yet another example, the multiplexers 226,228 operate in the absence of applied control signals. To illustrate this latter most example, the multiplexers 226, 228 are implemented to comprise control circuitry 426 (see FIG. 4) that (i) is responsive to detection or provision of stimuli, e.g., real-world data such as timing information, temperature measurements and/or predictable inputs and (ii) controls the respective multiplexer's operation. (This latter most example indicates that the test mode generation circuit 222 and the supply voltage configuration circuit 234 can be integrated without departing from the principles of the invention.)

One or more of the input terminals 221, 223, 224 of the memory device 220 preferably are coupled to external connection points of the packaged integrated circuit at final test. That is, the external connection points of the integrated circuit typically are package pins, solder balls or other conventional structure typically used in the memory device 220. Moreover, the external connection points preferably are dual function, i.e., are not dedicated solely to providing for the voltage screening of this invention. More specifically, it is preferred that the external connection points be implemented either or both to have non-test functions (e.g., I/O or other control) and to have test-related functions other than the voltage screening of this invention. Nevertheless, it is understood that one or more of the input terminals 221, 223, 224 can be implemented absent of coupling to any external connection point and that one or more of the external connection points can be omitted from use in the device's operation.

Operation

Figure 3:
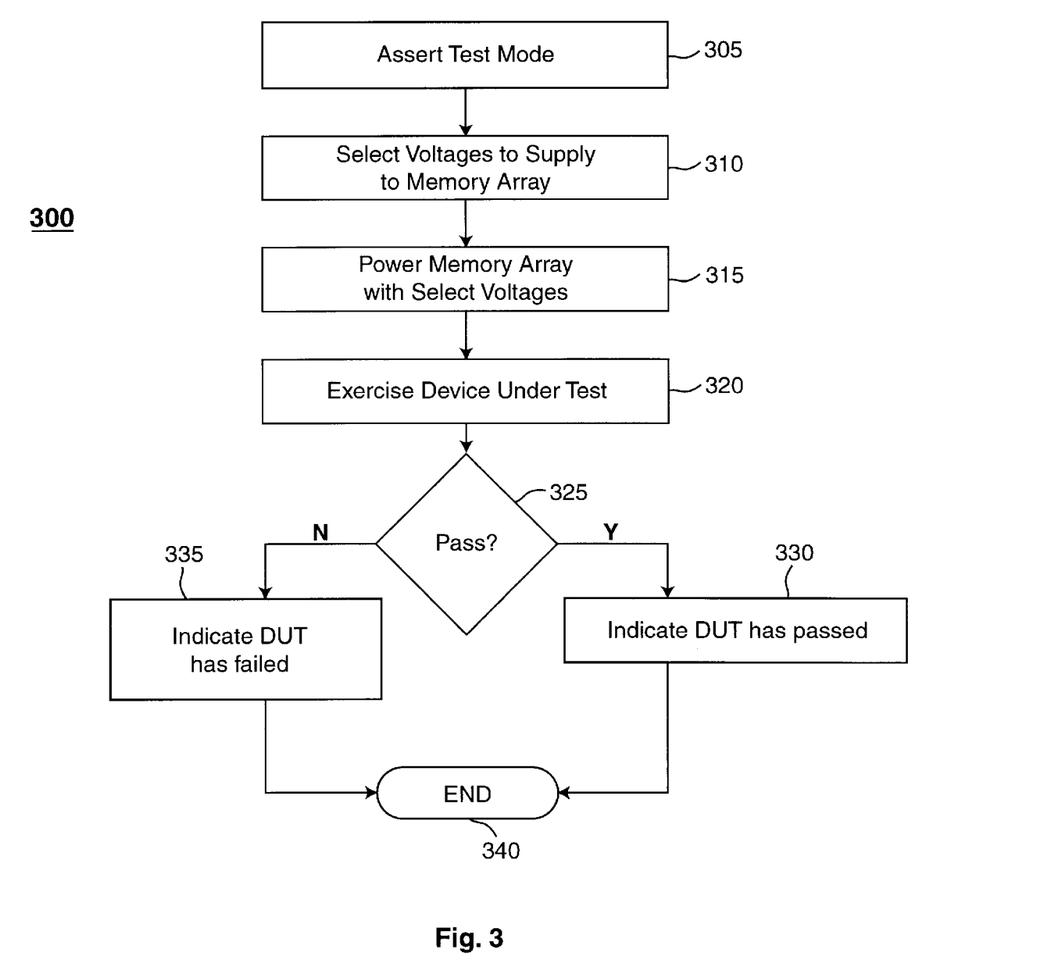
FIG. 3 is a flow chart illustrating reliability testing operation in accordance with the present invention.

FIG. 3 illustrates a process 300, in accordance with the present invention. More specifically, FIG. 3 illustrates an embodiment wherein various components of a memory array are coupled to supply voltages divergent from the specified supply voltages for the semiconductor memory device.

A test mode is asserted in a step 305 so as to activate the test mode generation circuit to decouple the memory array from the specified supply voltage(s). In a step 310, one or more voltages to be supplied to the memory array are selected. In a preferred embodiment, this step 310 also includes generating the selected voltages, preferably from one or more of the specified supply voltage(s).

In a step 315, the memory array is powered with the selected supply voltages. In a preferred embodiment, this step 315 includes selecting the voltage supply nodes to receive each of the respective selected supply voltages.

It is preferred that the selection of supply voltages and/or nodes, of step 315, responds to control signals provided, by a test mode generation circuit or otherwise, to a supply voltage configuration circuit. It is also preferred that the supply voltage configuration circuit couples the selected voltage to the selected nodes by employing one or more supply voltage multiplexers.

After the selected voltages are applied to the selected nodes, the memory device is exercised in a step 320. In a step 325, a determination is made as to whether the memory device under test has passed the test. If the memory device has passed, an indication of successful test completion is generated in a step 330, and the process ends in a step 340. However, if the memory device has not passed, an indication of unsuccessful test completion is generated in a step 335, and the process ends in a step 340. Indications of successful or unsuccessful test completion may take any convenient form, for example, computer printout, red or green light, physically moving the device under test to an area reserved for good or bad parts, and so on.

As a result of the testing, the memory device may be (i) discarded, such as at wafer or final test or (ii) corrected, such as by bypassing the unreliable cell in favor of another, i.e., in a redundant memory array, whether this is in wafer/final test, in customer screening or in the field. A failure can also be implemented to trigger servicing of the memory device's host product in the field, such as by automatically sending a service message (via, e.g., modem, radio or satellite links). A failure can also be implemented to trigger an operation-sustaining process, such as by establishing one or more supply voltages directed to counter the reliability issue(s) uncovered in the test until the memory can be replaced.

Those skilled in the art having the benefit of this disclosure will recognize that process 300 may be repeated with different voltage selections, or different node selections, or different test patterns, or combinations of these factors. Those skilled in the art will also recognize that the steps 305 and 310 embrace embodiments wherein (i) the peripheral circuitry of the memory device is decoupled from the specified voltage supplies and (ii) selected voltages are applied to selected nodes of the peripheral circuitry, such voltages preferably being selected and applied independently from those selected and applied to the memory array.

Alternative Testing Environments

Integrated circuits embodying the present invention not only facilitate screening by the semiconductor manufacturer, but also facilitate implementation of advanced diagnostic and reliability testing in systems.

Figure 4:
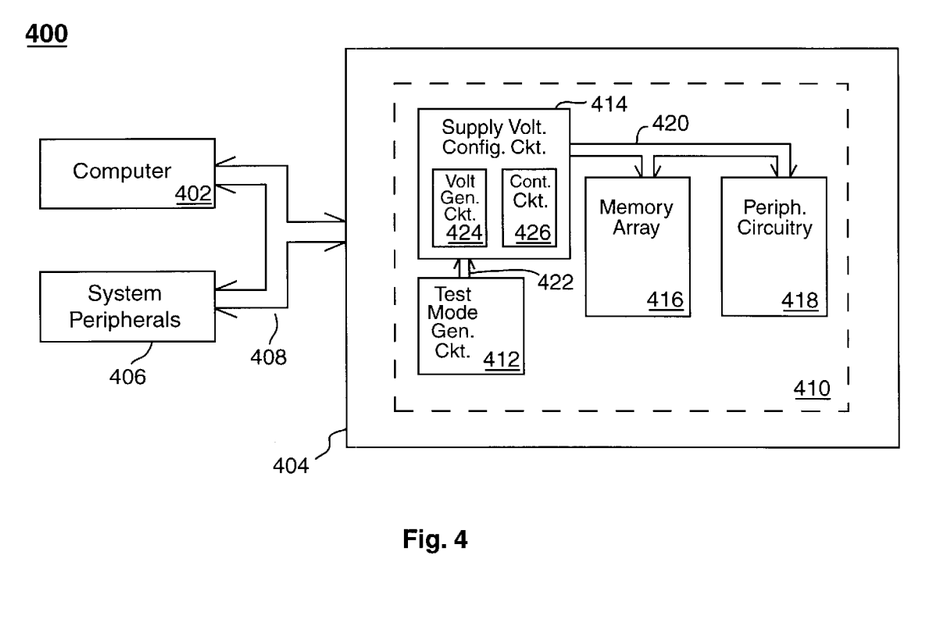
FIG. 4 is a system comprising a processing device and a memory device, in accordance with the present invention.

FIG. 4, for example, shows a system 400 that comprises a computer 402, system memory 404, and system peripherals 406, all of which are connected by a bus 408. The system memory 404 includes a memory device 410 that is implemented according to the present invention. Memory device 410 comprises a test mode generation circuit 412, a supply voltage configuration circuit 414, a memory array 416 and peripheral circuitry 418. The supply voltage configuration circuit 414 provides, via supply power bus 420, selected supply voltages to the memory array 416 and to the peripheral circuitry 418.

The supply voltages are either/both provided to the supply voltage configuration circuit 414 or/and generated by the circuit 414. In the generation case, it is preferred that the circuit 414 comprise voltage generation circuitry 424 that derives the supply voltages from one or more provided voltage sources, in particular from one or more specified voltage sources.

The supply voltage configuration circuit 414 selects the provided supply voltages responsive to control signals provided, via connection 422, by the test mode generation circuit 412 or by control circuitry 426 of the multiplexer itself. In the former case, the test mode generation circuit 412 generates the control signals either (i) responsive to additional control signals received from any of the memory system 404, the computer 402 or the system peripherals 406 or (ii) responsive to stimuli it is implemented to detect or receive (e.g., the passage of a predetermined amount of time from some event or events, as detected through a counter). In the latter case, the control circuitry 426 preferably is responsive to detection or provision of stimuli, e.g., real-world data such as timing information, temperature measurements and/or predictable inputs. In another embodiment, the memory device 410 comprises both control circuitry 426 and test mode generation circuit 412.

Although computer systems typically run system memory tests that merely write and read back data patterns, the computer 402 is enabled—by employing the memory device 410—to conduct enhanced testing wherein changes in performance versus voltage can be monitored at any one time or over time. Such monitoring can be accomplished, e.g., by running a characterization test at regular or triggered intervals and comparing the results thereof to previous test results, the previous test results being stored either locally or remotely. In such case, the comparison preferably is directed to failure prediction. Such prediction can be based on any appropriate measure, including, as examples, (i) qualification of changes in the results over one or more tests or (ii) an instant result. In one embodiment, this in field testing can be accomplished via the operating system. In another embodiment, the testing can be otherwise implemented. In any case, the testing is directed to alert the computer system 400 (or the system's user) of potential failures, particularly as to such failures that have not yet occurred but for which the probability has changed (e.g., increased).

For the purposes of embodying the present invention, the computer may be any combination or aggregation of interconnected electrical, electronic, mechanical, or optical components that accepts information in any form as an input and processes that information in a transformative way to produce an output.

Conclusion

The present invention provides methods, apparatus and systems for determining certain reliability characteristics of integrated circuits by voltage screening. In the case of memory devices, the present invention provides for determining reliability characteristics of the memory cells that make up a memory array by operating the memory cells at a voltage or voltages that diverge from either/both (i) the memory array's typical operating voltage(s)and (ii) the peripheral circuitry's operating voltage(s). Such voltage screening of memory cells is achieved by adjusting memory cell voltage supplies independently from each other and/or from the peripheral circuitry's voltage supplies.

An advantage of embodiments of the present invention is that reliability screening can be done without time-consuming heat soaking.

A further advantage of embodiments of the present invention is that in-system and in-field failure prediction can be achieved.

Embodiments of the present invention may also be used for integrated circuits other than memory devices so as to screen for units that have or are likely to have reliability problems. For example, integrated circuits having blocks that are particularly sensitive to a voltage supply levels (e.g., analog circuits) may be characterized, tested and otherwise operated to identify reliability issues, that process being conducted under various voltage supply conditions wherein the sensitive block is operated at one or more voltages different from those supplied to other portions of the integrated circuit.

It will be understood that various other changes in the details, materials, and arrangements of the parts and steps which have been described and illustrated in order to explain the nature of this invention may be made by those skilled in the art without departing from the principles and scope of the invention as expressed in the subjoined claims.

What is claimed is:

1. A method of testing an integrated circuit having a first circuit block and a second circuit block, the first circuit block having at least one specified supply voltage for operation, and the second circuit block having at least one specified supply voltage for operation, the method comprising:

selecting first and second supply voltages, at least one of which diverges from and is selected substantially independently of one of the specified supply voltages associated with the integrated circuit;

applying the first supply voltage to the first circuit block and the second supply voltage to the second circuit block, so that at least one of the first and second circuit blocks is provided with other than its specified supply voltage;

exercising the integrated circuit according to a selected screening test, the screening test having predetermined screening criteria indicating the quality of the results; and, comparing the observed results of exercising the circuit to the predetermined criteria so as to enable determination of certain reliability characteristics for the circuit.

2. A method as claimed in claim 1, wherein the voltage selecting step comprises selecting first and second supply voltages that diverge from each of the specified supply voltages.

3. A method as claimed in claim 2, wherein the voltage selecting step comprises selecting first and second supply voltages that diverge from each other, these voltages being selected substantially independently of one another.

4. A method as claimed in claim 1, wherein the voltage selecting and applying steps comprise providing at least one of the first and second circuit blocks with a respective supply voltage that is less than the block's specified supply voltage.

5. A method as claimed in claim 1, further comprising selecting and applying the first and second supply voltages responsive to the predetermined screening criteria.

6. A method as claimed in claim 1, wherein the voltage selecting step comprises providing at least one of the first and second supply voltages via an external pin of the integrated circuit in packaged form.

7. A method as claimed in claim 1, wherein the applying step comprises selecting plural nodes associated with at least one of the first and second circuit blocks and applying to the plural nodes, on a one-to-one basis, the respective selected supply voltage in combination with at least one of the other selected supply voltage and a specified supply voltage.

8. A method as claimed in claim 7, the applying step comprises using a supply voltage configuration circuit to apply at least one of the first and second supply voltages, the supply voltage configuration circuit providing for omission of application of at least one of the specified supply voltages.

9. A method as claimed in claim 7, wherein the selecting and applying steps comprise applying to at least one of the first and second circuit blocks, at respective nodes, both the first and the second supply voltages, each such supply voltage being selected substantially independently of the other and diverging from the specified supply voltage respectively associated with said circuit block, the divergence being at least one of (i) both higher, (ii) both lower, and (iii) one higher and one lower.

10. A method as claimed in claim 1, wherein the comparing step comprises comparing the results of the exercising step to results of a previously completed exercising step.

11. A method as claimed in claim 1, further comprising using a semiconductor memory device as the integrated circuit, the semiconductor device having a memory array and peripheral circuitry, the first block comprising the memory array, and the second block comprising the peripheral circuitry.

12. A method as claimed in claim 11, wherein the applying step comprises providing the memory array with a selected first supply voltage that is other than the specified supply voltage of the memory array, the first supply voltage being applied to at least one voltage supply node associated with the memory array, the voltage supply node being coupled to at least one of (i) a memory cell load device, (ii) a memory cell pull-down device, (iii) a bit line load device, (iv) wordline driver pull-up device, and (v) a wordline driver pull-down device.

13. A method as claimed in claim 12, wherein the selecting step comprises selecting at least one additional supply voltage that diverges from the specified supply voltage of the memory array, and wherein the applying step comprises selecting plural nodes associated with the memory array and applying to the plural nodes, on a one-to-one basis, a selected combination of the first supply voltage with at least one of the additional and specified supply voltages.

14. A method as claimed in claim 1, further comprising using a semiconductor memory device as the integrated circuit, the semiconductor memory device having a memory array, and the first and second blocks comprising separate portions of the memory array.

15. A method as claimed in claim 14, wherein the applying step comprises providing the selected first and second supply voltages to respective to at least one voltage supply node of the memory array, each of the voltage supply nodes being coupled to respective at least one (i) memory cell load device, (ii) memory cell pull-down device, (iii) bit line load device, (iv) wordline driver pull-up device and (v) a wordline driver pull-down device.

16. A method of field testing an integrated circuit, the integrated circuit being incorporated in a system and having a first circuit block and a second circuit block, the first circuit block having at least one specified supply voltage for operation, and the second circuit block having at least one specified supply voltage for operation, the method comprising:

selecting first and second supply voltages, at least one of which diverges from and is selected substantially independently of one of the specified supply voltages associated with the integrated circuit;

applying the first supply voltage to the first circuit block and the second supply voltage to the second circuit block, so that at least one of the first and second circuit blocks is provided with other than its specified supply voltage;

exercising the integrated circuit according to a selected screening test, the screening test having predetermined screening criteria indicating the quality of the results;

comparing the observed results of exercising the integrated circuit to the predetermined criteria so as to enable determination of certain reliability characteristics for the circuit; and initiating, in response to a result indicating reliability issues, responsive procedures.

17. A method as claimed in claim 16, wherein the responsive procedures comprise at least one of (i) communicating a message indicating the need for servicing of the product respecting the integrated circuit, (ii) applying one or more sustaining supply voltages directed to sustaining proper operation of the integrated circuit and (iii) bypassing, substituting for or correcting each circuit block or portion thereof implicated by the reliability issue.

18. A method as claimed in claim 16, wherein the step of applying sustaining supply voltages comprises generating at least one sustaining supply voltage from within the integrated circuit under field test.

19. A method as claimed in claim 16, wherein the selecting and applying steps comprise providing at least one of the first and second circuit blocks with a respective supply voltage that is less than the block's specified supply voltage.

20. A method as claimed in claim 16, further comprising selecting and applying the first and second supply voltages responsive to the predetermined screening criteria.

21. A method of testing a semiconductor memory device, the semiconductor memory device having a memory array and peripheral circuitry, the memory array having at least one specified supply voltage and the peripheral circuitry having at least one specified supply voltage, each specified supply voltage being associated with at least one voltage supply node of the respective memory array and peripheral circuitry, the method comprising:

selecting a first supply voltage that is lower than the specified supply voltage associated with at least one voltage supply node of the semiconductor memory device;

applying the first supply voltage to said at least one voltage supply node;

exercising the memory array according to a selected screening test, the screening test having predetermined screening criteria indicating the quality of the results;

observing the results of exercising the memory array; and comparing the observed results to the predetermined criteria so as to enable determination of certain reliability characteristics for the semiconductor memory device.

22. A method as claimed in claim 21, further comprising selecting a second supply voltage substantially independently of the first supply voltage, the second supply voltage diverging from the specified supply voltage associated with at least one voltage supply node of the semiconductor memory device, and applying the second supply voltage to said at least one voltage supply node, said application being in respect of such voltage supply nodes other than nodes to which the first supply voltage is applied.

23. A method as claimed in claim 22, further comprising:

applying the first and second supply voltages to respective at least one supply nodes of the memory array;

selecting a third supply voltage, the third supply voltage diverging from the specified supply voltage associated with one of more voltage supply nodes of the peripheral circuitry; and applying the third supply voltage to said at least one nodes of the peripheral circuitry.

24. A method as claimed in claim 23, further comprising applying one or more specified supply voltages to respective voltage supply nodes with which the one or more specified supply voltages are associated, each such respective voltage supply node being part of at least one of the memory array and the peripheral circuitry.

25. A method as claimed in claim 23, wherein applying the first and second supply voltages comprises applying said votages supplies to voltage supply nodes that are coupled to at least one of (i) a memory cell load device, (ii) a memory cell pull-down device, (iii) a bit line load device, (iv) wordline driver pull-up device, and (v) a wordline driver pull-down device.

26. An integrated circuit, the circuit supporting a screening mode and an operating mode, the circuit comprising:

a first circuit block, the first circuit block having at least one specified supply voltage associated with the operating mode;

a supply voltage configuration circuit coupled to the first circuit block so as to enable, in screening mode, selective provision to the first circuit block of at least one selected supply voltage that diverges from and is substantially independent of at least one of the specified supply voltages of the first circuit block.

27. An integrated circuit as claimed in claim 26, wherein the supply voltage configuration circuit comprises a voltage supply multiplexer.

28. An integrated circuit as claimed in claim 27, wherein the voltage supply multiplexer comprises at least one input terminal, the input terminals being coupled to respective voltage sources.

29. An integrated circuit as claimed in claim 28, wherein at least one of the respective voltage sources provides a specified supply voltage associated with the operating mode.

30. An integrated circuit as claimed in claim 27, wherein the voltage supply multiplexer comprises voltage generation circuitry, the voltage generation circuitry providing for selective generation of the at least one selected supply voltage.

31. An integrated circuit as claimed in claim 26, further comprising, in association with the supply voltage configuration circuit, at least one of control circuitry and a test mode generation circuit.

32. An integrated circuit as claimed in claim 26, wherein the first circuit block comprises a plurality of voltage supply nodes and the supply voltage configuration circuit is coupled to the voltage supply nodes so as to enable provision, to selected said nodes on a one-to-one basis, at least one of (i) a specified supply voltage associated with the respective node and (ii) one or more selected supply voltages, each of which supply voltages diverge from the specified supply voltage associated with the respective node and two or more of which supply voltages are selectable substantially independently of one another.

33. An integrated circuit as claimed in claim 32, wherein the first circuit block comprises a memory array, and the voltage supply nodes are coupled to at least one of (i) a memory cell load device, (ii) a memory cell pull-down device, (iii) a bit line load device, (iv) wordline driver pull-up device, and (v) a wordline driver pull-down device.

34. An integrated circuit as claimed in claim 32, further comprising a second circuit block having a specified supply voltage associated with the operating mode, the second circuit block being coupled to the supply voltage configuration circuit so as to enable selective provision of at least one selected supply voltage that diverges from the second circuit block's specified supply voltage.

35. An integrated circuit as claimed in claim 34, wherein the first circuit block comprises a memory array and the second circuit block comprises peripheral circuitry, and wherein the voltage supply nodes are coupled to at least one of (i) a memory cell load device, (ii) a memory cell pull-down device, (iii) a bit line load device, (iv) wordline driver pull-up device, and (v) a wordline driver pull-down device, and wherein the supply voltage configuration circuit is coupled to the voltage supply nodes so as to enable provision, to selected said nodes on a one-to-one basis, at least one of (a) the specified supply voltage associated with the node's circuit block and (b) one or more selected supply voltages, each of which supply voltages diverge from the node's specified supply voltage, the divergences of the so-provided selected supply voltages against the respective nodes' specified supply voltages being at least one of (I) all higher, (II) all lower and (III) a combination of higher and lower.

36. A system, the system supporting a screening mode and an operating mode, the system comprising:

a plurality of electrically interconnected integrated circuits, the circuits comprising a first circuit block and a supply voltage configuration circuit associated with the first circuit block;

the first circuit block having a specified supply voltage associated with the operating mode; and the supply voltage configuration circuit coupled to the first circuit block so as to enable, in screening mode, selective provision to the first circuit block of at least one selected supply voltage that diverges from and is substantially independent of the first circuit block's specified supply voltage.

37. The system of claim 36, wherein the plurality of electrically interconnected integrated circuits further comprise a second circuit block and a supply voltage configuration circuit associated with the second circuit block, the second circuit block having a specified supply voltage associated with the operating mode and being coupled to its associated supply voltage configuration circuit so as to enable, in screening mode, selective provision to the second circuit block of at least one selected supply voltage that diverges from the second circuit block's specified supply voltage.

38. The system of claim 37, wherein the first circuit block comprises a memory array and the second circuit block comprises peripheral circuitry, and wherein the first and second circuit blocks are associated with a single supply voltage configuration circuit and have respective one or more voltage supply nodes, the voltage supply nodes being coupled to at least one of (i) a memory cell load device, (ii) a memory cell pull-down device, (iii) a bit line load device, (iv) wordline driver pull-up device, and (v) a wordline driver pull-down device, and wherein the supply voltage configuration circuit is coupled to the voltage supply nodes so as to enable provision, to selected said nodes on a one-to-one basis, at least one of (a) the specified supply voltage associated with the node's circuit block and (b) one or more selected supply voltages, each of which supply voltages diverge from the node's specified supply voltage, the divergences of the so-provided selected supply voltages against the respective nodes' specified supply voltages being at least one of (I) all higher, (II) all lower and (III) a combination of higher and lower.

* * * * *